United States Patent [19]

Ohigashi et al.

[11] 3,961,265
[45] June 1, 1976

[54] VHF-UHF SWITCHING MECHANISM OF A TELEVISION RECEIVER

[75] Inventors: Tugio Ohigashi, Aichi; Junichi Ariga, Inazawa, both of Japan

[73] Assignee: Matsushita Electric Industrial Co., Ltd., Osaka, Japan

[22] Filed: Dec. 2, 1974

[21] Appl. No.: 528,630

[30] Foreign Application Priority Data

Dec. 3, 1973  Japan.................... 48-139627[U]

[52] U.S. Cl................................. 325/452; 74/10.8
[51] Int. Cl.².......................................... F16H 35/18
[58] Field of Search............... 74/10 R, 10.1, 10.27, 74/10.29, 10.45, 10.6, 10.8; 334/1, 47, 50, 52, 60, 88; 325/452, 458, 461

[56] References Cited

UNITED STATES PATENTS 3,824,507    7/1974    Speer et al.................... 74/10.8

*Primary Examiner*—Benedict V. Safourek
*Attorney, Agent, or Firm*—Stevens, Davis, Miller & Mosher

[57] ABSTRACT

This invention relates to a VHF-UHF switching mechanism of a television receiver provided with VHF and UHF tuners, and provides a VHF-UHF switching mechanism with a simple structure capable of selecting VHF and UHF channels by means of one main operation shaft.

2 Claims, 5 Drawing Figures

VHF-UHF SWITCHING MECHANISM OF A TELEVISION RECEIVER

This invention relates to a VHF-UHF switching mechanism of a television receiver, and aims to provide a VHF-UHF switching mechanism of a television receiver capable of easy VHF-UHF switching by means of one operation shaft.

The conventional VHF-UHF switching mechanism of a television receiver has been provided with independent shafts for VHF and UHF station selection. That is, the operation shaft of the VHF tuner is first adjusted, for example at the 13th channel (which is a channel capable of receiving UHF), and thereafter the operation shaft of the UHF tuner is rotated to select a VHF station. This method, however, requiring two different shafts for switching from a VHF to UHF or from UHF to a VHF channel, makes a complicated structure of the VHF-UHF switching mechanism. A further defect is that the operation of selecting a station is rather troublesome.

According to this invention, it is intended to remove such shortcomings and provide a simple and easy VHF-UHF switching mechanism. Namely, the switching mechanism of this invention enables a smooth switching between VHF and UHF by one shaft operation. Therefore, its very simple structure is advantageous from an economical view point.

The invention will be explained in more detail in conjunction with the accompanying drawings, in which.

Figure 1:
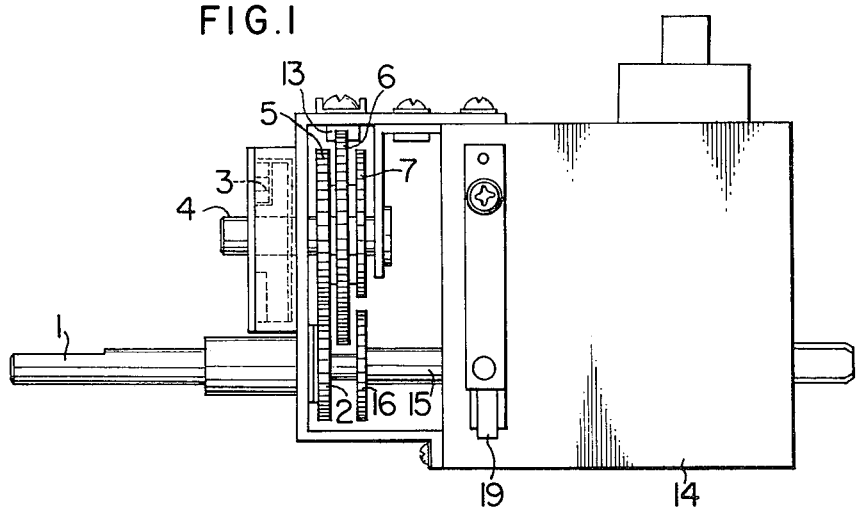
FIG. 1 is a side view of a VHF-UHF switching mechanism according to one embodiment of this invention.
Figure 2:
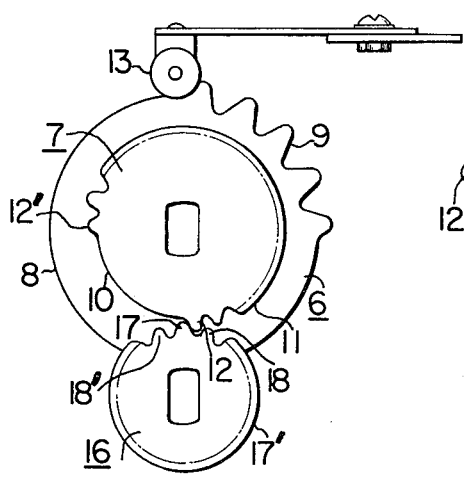
FIGS. 2, 3 and 4 are sectional views of the switching mechanism of this invention shown in FIG. 1.

In these figures, 1 designates a main operation shaft, 2 a spur gear fixed to the main shaft, 3 a switch for selecting a UHF station, and 4 a switch shaft on which a spur gear 5, a cam 6 and a segment gear 7 are fixed. The spur gears 2 and 5 are geared with each other. About three quarters of the outer periphery of the cam 6 is made of a circular arc 8, while the remaining one quarter thereof is made of a concave-convex surface 9. About one quarter of the outer periphery of the segment gear 7 is made of a circular arc 10, while the remaining three quarter thereof is made of a tooth-shaped surface 11. The teeth 12 and 12' positioned at both ends of the circular arc 10 are made lower than the other teeth 11. 13 designates a retaining ring which is in pressure contact with the peripheral surface of the cam 6, 14 a VHF tuner, and 15 a switch shaft for the tuner. This switch shaft 15 is loosely inserted in the inner end of the main operation shaft 1 on the common axis. 16 designates a spur gear which is geared with the segment gear 7. The teeth 18 and 18' positioned on both sides of a tooth 17 are made lower than the teeth 17 and 17'. 19 designates a cam for the VHF tuner 14. The cam 19 and the spur gear 16 are both fixed on the switch shaft 15 of the VHF tuner. The phase between the cam 6 and the segment gear 7 is so defined that they are positioned as shown in FIG. 2 when the retaining ring 13 is driven out of the top of the convex-concave surface of the cam 6.

Figure 5:
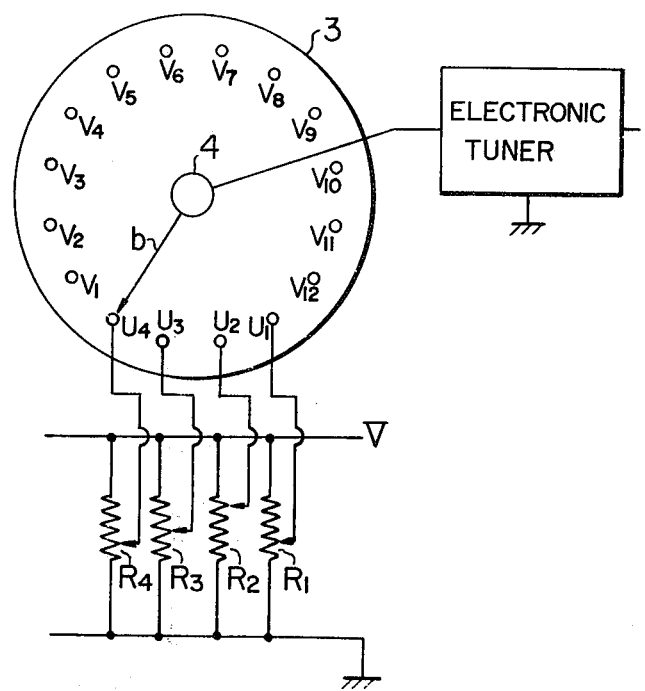
FIG. 5 shows roughly the switch for selecting a UHF station.

FIG. 5 shows a rough diagram of a switch for selecting a UHF station, which comprises a plurality of annularly arranged contact points $V_1$ to $V_{12}$ and $U_1$ to $U_4$ and a movable contact point $b$ rotated by the rotation of the switch shaft 4. The contact points $U_1$ to $U_4$ are connected with the sliding terminals of variable resistors $R_1$ to $R_4$ respectively so that voltages determined by these resistors are applied to the terminals $U_1$ to $U_4$. A selected voltage is thus applied to a diode having a variable capacitance in the electronic tuner, and serves to select a channel.

The switching mechanism of this invention shown in the drawings works as described hereinbelow. The rotation of the main operation shaft 1 is transmitted to the spur gear 5 by way of the spur gear 2. The spur gear 5 and the segment gear 7 which are fixed around the same shaft 4 cause rotation of the spur gear 16 fixed on the switch shaft 15 of the VHF tuner, whereby the cam 19 of the tuner 14 works and thus a VHF channel is selected. The selection of a UHF channel is made as follows. It is so arranged that, when the engagement between the segment gear 7 and the spur gear 16 ends, the VHF tuner 14 is adjusted at the 13th channel (which is capable of receiving UHF). At this step, the first or the last UHF channel is selected depending on the direction of rotation of the main operaton shaft 1. In a section from the end to the beginning of coupling between the segment ring 7 and the spur gear 16, with a coupling between the cam 6 and the retaining ring 13, one of the UHF channels $U_1, U_2 . . . . U_n$ is selected by means of the UHF selection switch 3 fixed around the switch shaft 4.

Figure 3:
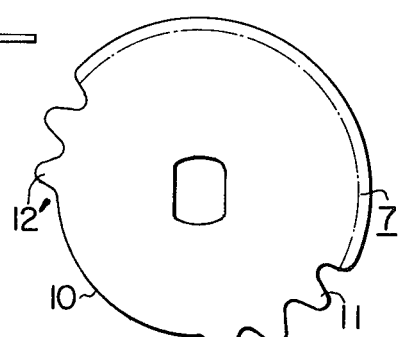
Figure 4:
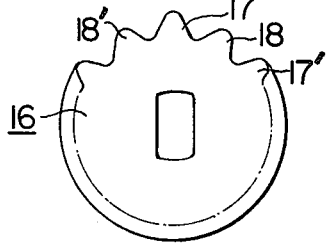

As seen in FIG. 3, in the segment gear 7 the teeth 12 and 12' are made lower than other teeth 11. As seen in FIG. 4, in the spur gear 16, the teeth 18 and 18' are made lower than other teeth 17 and 17'. Therefore, according to the UHF-VHF switching mechanism of this invention, when the main shaft is rotated, either the tooth 12 or 12' meets first with the tooth 17 of the spur gear 16 so that, at the time of switching between VHF and UHF, the torque of the main shaft does not differ whether it is rotated right or left. When a VHF station is received, the segment gear 7 and the spur gear 16 are coupled. At that time, with the detention of the cam 19 the switch 3 does not move at random except by the backlash of the gear. (It may move only during rotation of the main shaft.)

What we claim is:

1. A VHF-UHF switching mechanism for a television receiver having a VHF tuner including a tuner shaft therein, comprising
   a rotatably supported main operation shaft;
   a first spur gear fixed to said main operation shaft;
   a switch shaft rotatably supported adjacent said main operation shaft;
   a second spur gear fixed to said switch shaft, said second spur gear meshing with said first spur gear;
   a switch coupled to said switch shaft, operation of said switch switching between UHF stations in regular sequence in accordance with the rotational position of said switch shaft;
   a segment gear fixed to said switch shaft, part of the outer periphery thereof being formed as a circular arc and the remaining part being formed as a toothed gear surface, the heights of the two teeth positioned on both sides of the circular arc surface of said segment gear being lower than the heights of the remaining teeth on said segment gear; and
   a third spur gear fixed to the tuner shaft of said VHF tuner, said third spur gear being geared to the toothed gear surface of said segment gear, one tooth of said third spur gear being higher than the other teeth on said third spur gear.

2. A VHF-UHF switching mechanism according to claim 1, wherein a cam is fixed to said switch shaft, a part of the outer periphery of said cam being formed as a circular arc and the remaining part thereof being formed as a convex-concave surface, and a retaining ring in pressure contact with the outer periphery of said cam, said retaining ring being engaged with said convex-concave surface of said cam.

* * * * *